United States Patent [19]
Hoss et al.

[11] Patent Number: 6,134,116
[45] Date of Patent: Oct. 17, 2000

[54] APPARATUS AND METHOD FOR LATCHING A DOOR IN A COMPUTER SYSTEM

[75] Inventors: Shawn P. Hoss, Round Rock; Zac Cravens, Austin, both of Tex.

[73] Assignee: Dell USA, L. P., Round Rock, Tex.

[21] Appl. No.: 09/299,389

[22] Filed: Apr. 27, 1999

[51] Int. Cl.[7] .............................. H05K 7/00; H05K 5/02; H05K 5/03; G06F 1/16; E05C 1/08
[52] U.S. Cl. ........................ 361/747; 361/683; 361/726; 361/752; 361/754; 364/708.1; 292/146
[58] Field of Search .................................. 361/683, 684, 361/686, 727, 679, 685, 724, 726, 728, 730, 732, 752, 754; 364/708.1; 292/DIG. 61, 171, 175, 146, DIG. 31, DIG. 63, DIG. 38, 145, 153; 70/208, 210, 144, 145, 467, 484

[56] References Cited

U.S. PATENT DOCUMENTS

| | | | |
|---|---|---|---|
| 172,191 | 1/1876 | Sparks | 292/175 |
| 190,792 | 5/1877 | Sparks | 292/175 |
| 229,856 | 7/1880 | Bourke | 116/15 |
| 362,805 | 5/1887 | Williams | 292/175 |
| 1,036,646 | 8/1912 | Klonower | 70/208 |
| 1,191,502 | 7/1916 | Emme | 292/175 |
| 1,823,303 | 9/1931 | Way | 292/228 |
| 3,841,674 | 10/1974 | Bisbing et al. . | |
| 3,850,464 | 11/1974 | Bisbing et al. . | |
| 3,918,751 | 11/1975 | Blake | 292/126 |
| 4,652,030 | 3/1987 | Streett | 292/336.3 |
| 4,790,579 | 12/1988 | Maxwell et al. . | |
| 5,062,671 | 11/1991 | Goetz et al. . | |
| 5,150,933 | 9/1992 | Myslicki et al. . | |
| 5,158,329 | 10/1992 | Schlack . | |
| 5,227,957 | 7/1993 | Deters | 361/686 |
| 5,351,176 | 9/1994 | Smith et al. | 361/686 |
| 5,482,333 | 1/1996 | Gehrs et al. . | |
| 5,570,915 | 11/1996 | Asadurian | 292/242 |
| 5,774,331 | 6/1998 | Sach | 361/683 |
| 5,785,398 | 7/1998 | Park | 312/223.2 |
| 5,878,608 | 3/1999 | Alyanakian . | |
| 5,896,273 | 4/1999 | Varghese et al. | 361/724 |

*Primary Examiner*—Leo P. Picard
*Assistant Examiner*—Anatoly Vortman
*Attorney, Agent, or Firm*—Haynes and Boone, LLP

[57] ABSTRACT

A computer system including a chassis and a microprocessor mounted in the chassis. An input device is coupled to provide input to the microprocessor and a mass storage device is coupled to the microprocessor. A display is coupled to the microprocessor by a video controller and a system memory coupled to provide storage to facilitate execution of computer programs by the microprocessor. A bezel is mounted on the chassis and a bezel door is pivotally mounted to the bezel. A latch is mounted to the bezel door. The latch is movable between a first position and a second position. A resilient member is operatively mounted between the bezel door and the latch. The resilient member is biased to maintain the latch in the first position.

10 Claims, 3 Drawing Sheets

APPARATUS AND METHOD FOR LATCHING A DOOR IN A COMPUTER SYSTEM

BACKGROUND

The disclosures herein relate generally to computer systems and more particularly to an apparatus and method for latching a door in a computer system.

Computer systems such as servers typically include a chassis having various system components mounted on it. The chassis is typically a metal structure constructed to meet various functional requirements such as mounting of components, air flow to the components, security of the components and the like. Because functionality is the main intent of the chassis, it generally does not provide a great degree of aesthetic appeal.

One or more bezels are generally mounted on the front of a chassis to improve the aesthetic appeal of the computer system. The bezel is typically injection molded or otherwise formed of plastic. The bezel may include one or more bezel doors that provide access to the various system components mounted to the chassis. In cases where a component is being removed from the chassis, the bezel may be removed or the door may be opened to provide the required access.

The bezel doors are typically hinged and include a latch for being secured in the closed position. As the bezel doors are typically made of plastic, a cantilevered-type latch is generally integrally molded directly into the bezel door. Due to excessive force, age, and other conditions, these molded-in latches often break. This precludes the door from being secured in a closed position without using a locking device, if so included in the bezel. Equally adverse to the latch breaking is that the entire bezel door must be replaced.

In addition to durability issues, molded-in bezel door latches lack a precision feel and ability to exhibit a precision latching action. These adverse performance characteristics stem from the design and performance of the molded in latches being limited by the material from which the bezel door is made. Various limitations associated with the molding process employed to make the bezel door also affect the ability to fine-tune the performance of molded-in bezel door latches.

Bezel door latches having a sliding latch assembly with an integrally formed spring member are also known. For example, U.S. Pat. No. 5,062,671 discloses a latch assembly that includes a catch having a beveled edge that engages the chassis of the bezel to secure the bezel door in a closed position. The spring member is integrally formed to provide a suitable latch retention force. The ability to fine-tune the force characteristics on the integrally-formed spring member is limited by the materials and manufacturing processes employed to make the entire assembly. Furthermore, failure of the catch or spring member portion requires that the entire latch assembly be replaced.

Accordingly, a need has arisen for an apparatus for reliably and durably latching the bezel door of a computer system in the closed position.

SUMMARY

One embodiment, accordingly, provides a durable latch assembly for reliably latching a bezel door in the closed position. To this end, one embodiment provides a latch assembly including a bezel door and a latch mounted to the bezel door. The latch is movable between a first position and a second position. A resilient member is operatively mounted between the bezel door and the latch. The resilient member is biased to maintain the latch in the first position.

Several advantages are achieved by a latch assembly according to embodiments presented herein. The pre-load and release force of the latch assembly can be tailored to provide a superior level of performance relative to conventional latch assemblies. The force generated by the spring is approximately linear over the range of operation. The latch assembly is considerably more robust than conventional latch assemblies. Defective components can be individually replaced.

BRIEF DESCRIPTION OF THE DRAWING FIGURES

DETAILED DESCRIPTION

Figure 1:
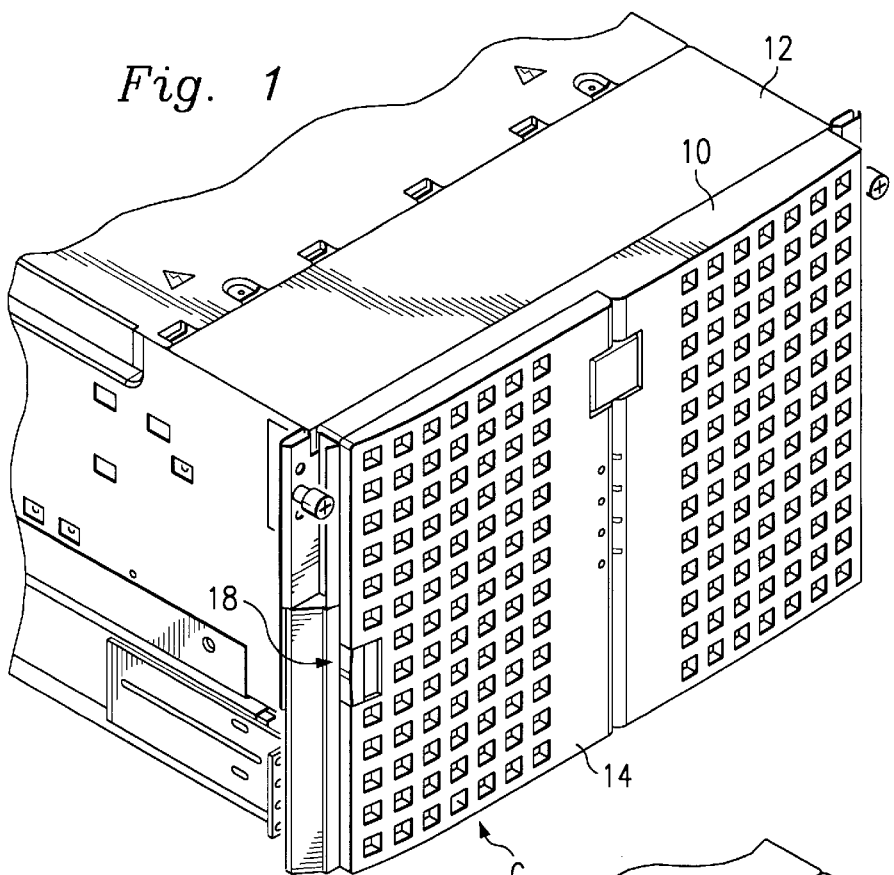
FIG. 1 is fragmentary, perspective view showing an embodiment of a computer system having a bezel door in the closed position.
Figure 2:
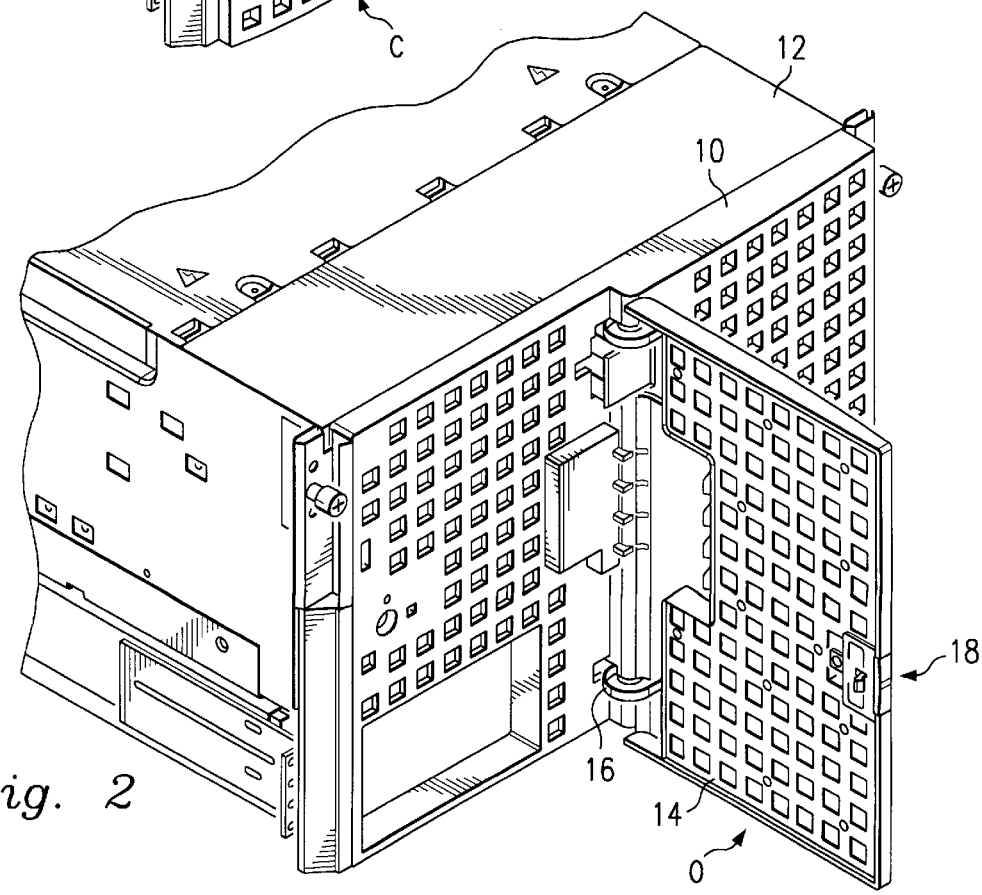
FIG. 2 is a fragmentary, perspective view showing an embodiment of a computer system having a bezel door in the open position.

FIGS. 1 and 2 illustrate a computer having a bezel 10 attached to a chassis 12. A bezel door 14 is pivotably attached to the bezel 10 by hinges 16 such that the bezel door 14 may be moved between an open position O and a closed position C. The bezel door 14 includes a latch assembly 18, FIG. 3, that secures the bezel door 14 in the closed position C.

Figure 3:
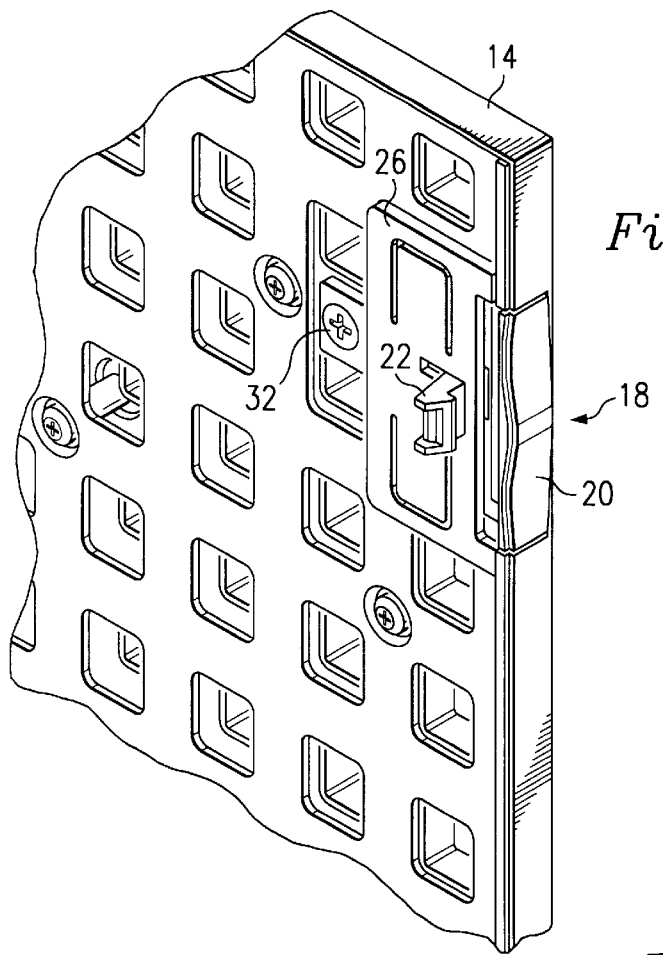
FIG. 3 is a fragmentary perspective view showing an embodiment of a bezel door and latch assembly.
Figure 4:
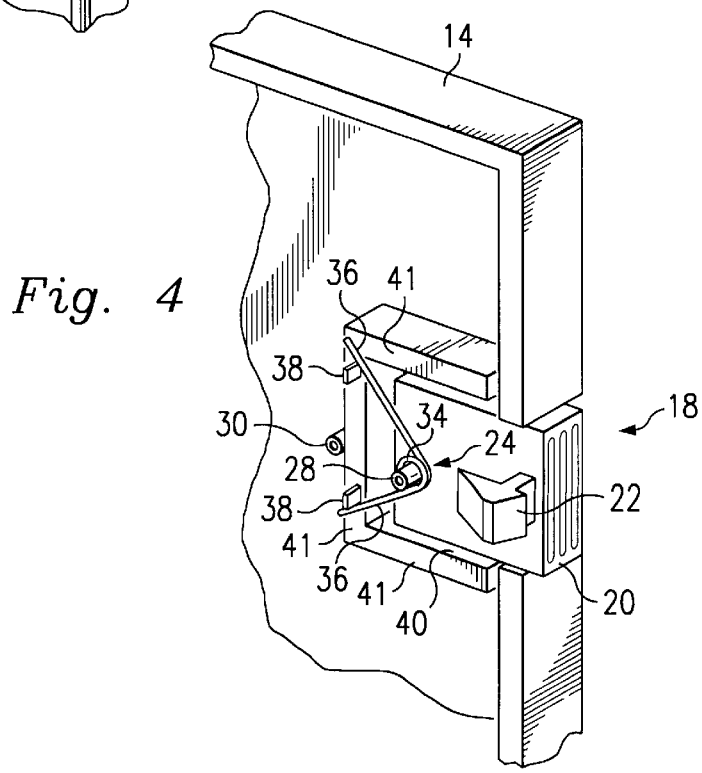
FIG. 4 is a perspective view illustrating an embodiment of a latch assembly.

As best illustrated in FIGS. 3 and 4, the latch assembly 18 includes a latch 20 having an attached catch 22, a resilient member such as the torsion spring 24 operatively mounted between the latch 20 and the bezel door 14 and a latch cover 26 for securing the latch 20 and resilient member 24 in place. A retention boss 28 is used to attach the torsion spring 24 to the latch 20. The latch cover 26 is secured to the bezel door 14 by a fastener such as a screw 32 retained in a mounting boss 30.

The torsion spring 24 includes a coiled portion 34 mounted on the retention boss 28. The torsion spring 24 further includes two elongated legs 36 extending in divergent directions from the coiled portion 34. Each leg 36 is engaged against a protruding member 38 such that the torsion spring 24 develops a resistive force in response to the latch 20 being moved from the first position to the second position. The resistive force is applied in the coiling direction to prevent over-stressed conditions.

Figure 5:
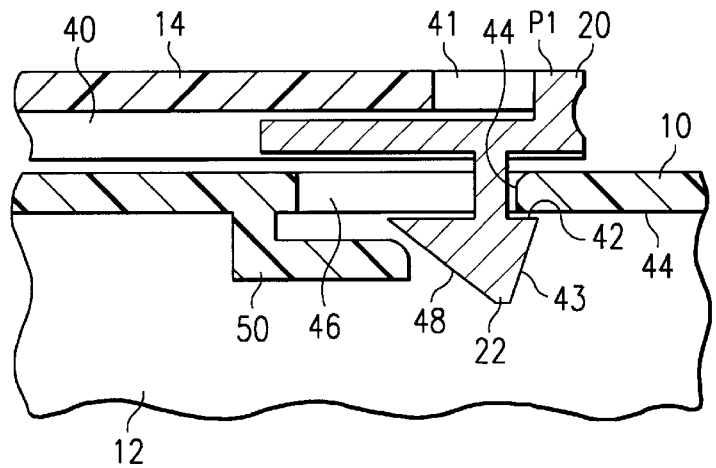
FIG. 5 is a cross sectional view illustrating an embodiment of a latch in a first position.
Figure 6:
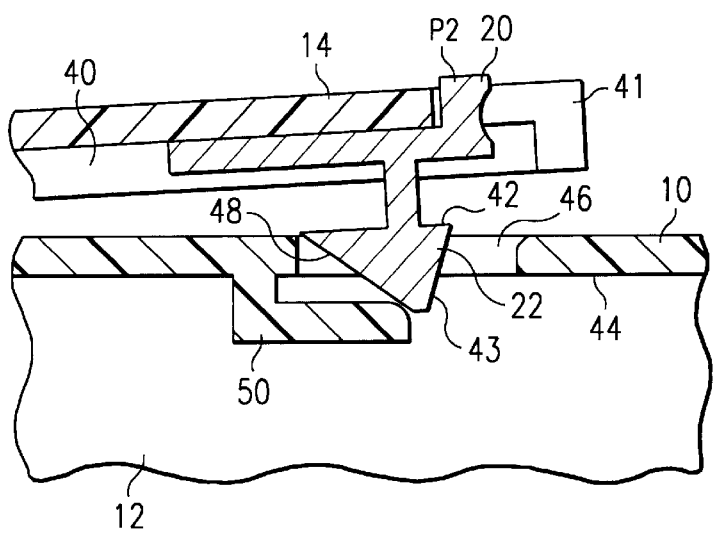
FIG. 6 is a cross sectional view illustrating an embodiment of a latch in a second position.

Now referring to FIGS. 5 and 6, the latch 20 is slidably mounted to the bezel door 14 in a channel 40 such that it is moveable between a first position P1, FIG. 5, and a second position P2, FIG. 6. As illustrated, the channel 40 is established by a plurality of walls 41 attached to the bezel door. In an alternate embodiment, not shown, the plurality of walls 41 may be attached to the latch cover 26. The first position P1 corresponds to the latch 20 being in a position to secure the bezel door 14 in the closed position C, FIG. 1. The second position P2, FIG. 6, corresponds to the latch 20 being in a position enabling the bezel door 14 to be moved to the open position O, FIG. 2.

The catch 22, FIGS. 5 and 6, includes a land 42 that engages an adjacent edge 44 of an opening 46 in the bezel 10 to secure the bezel door 14 in the closed position C. The catch 22 is provided with a first ramp 43 for urging the latch 20 to the second position P2 in response to the catch 22 being engaged by the bezel 10 as the bezel door 14 is moved to the closed position. The catch 22 may also include a second ramp 48 that engages a flange 50 to urge the bezel door 14 to the open position O in response to the latch 20 being moved from the first position P1 to the second position P2. As illustrated, the flange 50 may be attached to the bezel 10, or in an alternate embodiment, not shown, the flange 50 may be attached to the chassis 12. The first ramp 43 and the adjacent edge 44 of the opening 46 are configured to provide a first displacement of the latch 20. The second ramp 48 and the flange 50 are configured to provide a second displacement of the latch 20. The first displacement is less than the second displacement.

Figure 7:
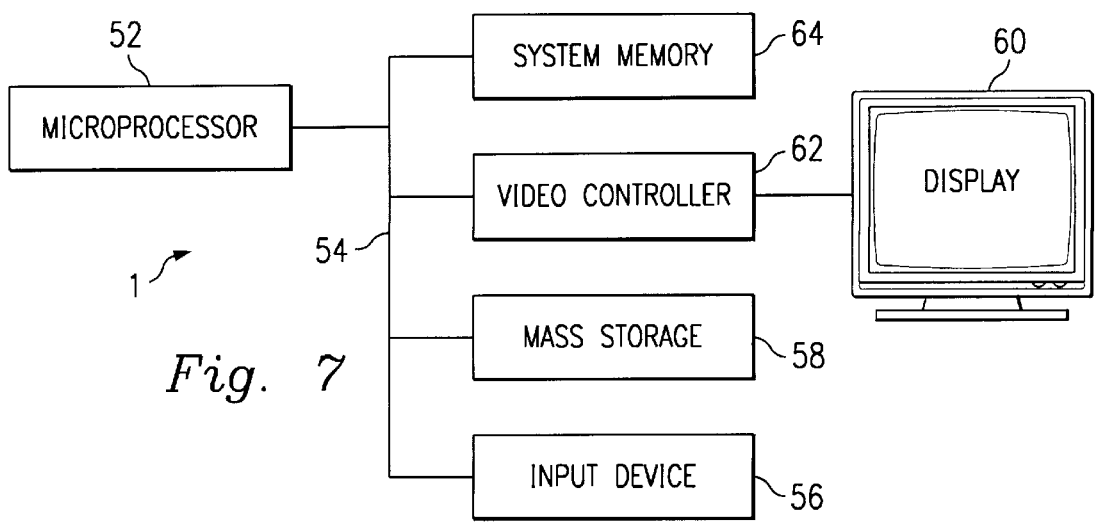
FIG. 7 is a block diagram illustrating an embodiment of a computer system.

FIG. 7 illustrates an embodiment of a computer system, indicated generally at 1. The computer system 1 includes at least one microprocessor 52. The microprocessor 52 is connected to a bus 54. The bus 54 serves as a connection between the microprocessor 52 and other components of the computer system 1. An input device 56 is coupled to the microprocessor 52 to provide input to the microprocessor 52. Examples of input devices include keyboards, touchscreens, and pointing devices such as a mouse, a trackball and a trackpad. The computer system 1 further includes a display 60 which is coupled to the microprocessor 52 typically by a video controller 62. Programs and data are stored on a mass storage device 58 which is coupled to the microprocessor 52. Mass storage devices include components such as hard disks, optical disks, magneto-optical drives, floppy drives, and the like. The system memory 64 provides the microprocessor 52 with fast storage to facilitate execution of computer programs by the microprocessor 52. It should be understood that other busses and intermediate circuits can be employed between the components described above and microprocessor 52 to facilitate interconnection between the components and the microprocessor.

In operation, the embodiments disclosed herein provide a latch assembly having a latch that is slidably mounted to the bezel door. The latch is maintained in a first position by a resilient member separably mounted between the bezel door and the latch. The door may be released from a secured, closed position and moved towards an open position by moving the latch from a first position to a second position.

As a result, one embodiment provides a latch assembly including a bezel door and a latch mounted to the bezel door. The latch is movable between a first position and a second position. A resilient member is operatively mounted between the bezel door and the latch. The resilient member is biased to maintain the latch in the first position.

Another embodiment provides a computer system including a chassis; a microprocessor mounted in the chassis; an input coupled to provide input to the microprocessor; a mass storage coupled to the microprocessor; a display coupled to the microprocessor by a video controller and a system memory coupled to provide storage to facilitate execution of computer programs by the microprocessor. A bezel is mounted on the chassis and a bezel door is pivotally mounted to the bezel. A latch is mounted to the bezel door. The latch is movable between a first position and a second position. A resilient member is operatively mounted between the bezel door and the latch. The resilient member is biased to maintain the latch in the first position.

Still another embodiment provides a method of making a latch assembly including the steps of providing a bezel door; attaching a latch movable between a first position and a second position to the bezel door; and operatively mounting a resilient member between the bezel door and the latch. The resilient member is biased to maintain the latch in the first position.

As it can be seen, the illustrative embodiments presented herein provide several advantages. The pre-load and release force of the latch assembly can be tailored to provide a superior level of performance relative to conventional latch assemblies. The force generated by the spring is approximately linear over the range of operation. The latch assembly is considerably more robust than conventional latch assemblies. Defective components can be individually replaced.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A latch assembly, comprising:
   a bezel door;
   a latch mounted on the bezel door, the latch being movable between a first position and a second position;
   a resilient member operatively mounted between the bezel door and the latch, the resilient member biased to maintain the latch in the first position;
   the latch including a catch having a first ramp for engaging an adjacent edge of an opening in a bezel of a computer system when the bezel door is moved to the closed position; and
   the latch including a second ramp and the bezel including a flange, the second ramp being adjacent the flange when the bezel door is in the closed position, the second ramp engaging the flange to urge the bezel door from the closed position to the open position when the latch is moved from the first position to the second position.

2. The latch assembly of claim 1 wherein the first ramp and the adjacent edge of the opening in the bezel are configured to provide a first displacement of the latch and wherein the second ramp and the flange are configured to provide a second displacement of the latch, the first displacement being less than the second displacement.

3. A latch assembly, comprising:
   a bezel door;
   a latch mounted on the bezel door, the latch being movable between a first position and a second position;
   a resilient member operatively mounted between the bezel door and the latch, the resilient member biased to maintain the latch in the first position;
   the latch including a catch having a first ramp and a second ramp, the first ramp orientated on a surface of the catch generally opposite the second ramp; and
   a plurality of protruding members attached to the bezel door, the resilient member being a torsion spring having two legs of approximately the same length and a coiled portion, each leg of the torsion spring engaging a respective protruding member, the protruding members engaged by the legs of the torsion spring being spaced approximately equidistant from the coiled portion of the spring such that a balanced force is applied by the torsion spring to the latch.

4. The latch assembly of claim 3 wherein the coiled portion of the spring is attached to the latch.

5. A latch assembly, comprising:

a bezel door;

a latch mounted on the bezel door, the latch being movable between a first position and a second position;

a resilient member operatively mounted between the bezel door and the latch, the resilient member biased to maintain the latch in the first position;

the resilient member being a torsion spring;

the torsion spring having two elongated legs, the two legs being approximately the same length;

the torsion spring having a coil portion formed between the two legs; and a plurality of protruding members attached to the bezel door, each leg of the torsion spring engaging a respective protruding member and the protruding members engaged by the legs of the torsion spring being spaced approximately equidistant from the coiled portion of the spring such that a balanced force is applied by the torsion spring to the latch.

6. The latch assembly of claim 5 wherein the bezel door includes a plurality of walls defining a channel, the latch being mounted to slide in the channel.

7. A latch assembly, comprising:

a bezel door;

a latch mounted on the bezel door, the latch being movable between a first position and a second position;

a resilient member operatively mounted between the bezel door and the latch, the resilient member biased to maintain the latch in the first position; and a plurality of protruding members attached to the bezel door, the resilient member being a torsion spring having two legs of approximately the same length and a coiled portion, each leg of the torsion spring engaging a respective protruding member, the protruding members engaged by the legs of the torsion spring being spaced approximately equidistant from the coiled portion of the spring such that a balanced force is applied by the torsion spring to the latch.

8. The latch assembly of claim 7 further comprising a latch cover removably mounted to the bezel door.

9. The latch assembly of claim 7 wherein the resilient member and the latch are separably connected.

10. A computer system, comprising:

a chassis;

a microprocessor mounted in the chassis;

an input coupled to provide input to the microprocessor;

a mass storage coupled to the microprocessor;

a display coupled to the microprocessor by a video controller;

a system memory coupled to provide storage to facilitate execution of computer programs by the microprocessor;

a bezel mounted on the chassis;

a bezel door pivotally mounted to the bezel;

a latch mounted on the bezel door, the latch being movable between a first position and a second position;

a resilient member operatively mounted between the bezel door and the latch, the resilient member biased to maintain the latch in the first position;

the latch including a catch having a first ramp for engaging an adjacent edge of an opening in the bezel when the bezel door is moved to the closed position; and the latch including a second ramp, the bezel including a flange, the second ramp being adjacent the flange when the bezel door is in the closed position, the second ramp engaging the flange to urge the bezel door from the closed position to the open position when the latch is moved from the first position to the second position.

* * * * *